United States Patent
He

(10) Patent No.: US 9,194,970 B2
(45) Date of Patent: Nov. 24, 2015

(54) METHOD OF POLES CONFIGURATION WITH FOUR POLES INTER-COMBINATION FOR MARINE ELECTROMAGNETIC SURVEYING

(75) Inventor: Zhanxiang He, Zhouzhou (CN)

(73) Assignees: CHINA NATIONAL PETROLEUM CORPORATION, Beijing (CN); BGP INC., CHINA NATIONAL PETROLEUM CORPORATION, Zhuozhou (CN)

( * ) Notice: Subject to any disclaimer, the term of this patent is extended or adjusted under 35 U.S.C. 154(b) by 288 days.

(21) Appl. No.: 13/822,241

(22) PCT Filed: Mar. 11, 2011

(86) PCT No.: PCT/CN2011/000391
§ 371 (c)(1),
(2), (4) Date: Mar. 11, 2013

(87) PCT Pub. No.: WO2012/058854
PCT Pub. Date: May 10, 2012

(65) Prior Publication Data
US 2013/0162257 A1 Jun. 27, 2013

(30) Foreign Application Priority Data
Nov. 4, 2010 (CN) .......................... 2010 1 0535969

(51) Int. Cl.
*G01V 3/12* (2006.01)
*G01V 1/38* (2006.01)
(Continued)

(52) U.S. Cl.
CPC . *G01V 3/12* (2013.01); *G01R 33/10* (2013.01); *G01V 1/38* (2013.01); *G01V 3/088* (2013.01)

(58) Field of Classification Search
CPC ......... G01R 33/10; G01V 1/38; G01V 3/088; G01V 3/12
USPC ................................................ 324/347, 365
See application file for complete search history.

(56) References Cited

U.S. PATENT DOCUMENTS 3,537,031 A * 10/1970 De Ment .......................... 372/77
4,999,559 A * 3/1991 Katz ............................. 318/696
(Continued)

FOREIGN PATENT DOCUMENTS

CN 1447924 A 10/2003
CN 1580818 A 2/2005
(Continued)

*Primary Examiner* — Jermele M Hollington
*Assistant Examiner* — Christopher McAndrew
(74) *Attorney, Agent, or Firm* — Birch, Stewart, Kolasch & Birch, LLP

(57) ABSTRACT

The present invention is a method of poles configuration with four poles inter-combination for marine electromagnetic surveying and acquisition. The method of the present invention adopts six horizontal electric field components with four poles inter-combination. The six horizontal electric field components are respectively constituted from tri-pins grounding electrodes of four poles pairwise. One of the pins of each of the tri-pins grounding electrodes and the pins of the other three tri-pins grounding electrodes mutually constitute the six horizontal electric field components. The data for electromagnetic field over time series are simultaneously recorded. The present invention effectively ensure that the electric field recording with an angle less than 22.5 degree to the activation direction is achieved regardless of the orientation of the acquisition station, and that the worst effective activation signal may reach 76.5% of that under collinear activation. It is ensured that the activation field source and the couple pole for recording the electric field are under strong coupling, the requirements on the orientation of the acquisition station and on the dragging direction and position of the activation field source in data acquisition are lowered, and loss of electromagnetic data is prevented.

6 Claims, 1 Drawing Sheet

(51) Int. Cl.
*G01V 3/08* (2006.01)
*G01R 33/10* (2006.01)

(56) References Cited

U.S. PATENT DOCUMENTS

| | | | | |
|---|---|---|---|---|
| 5,105,166 | A * | 4/1992 | Tsukii et al. | 330/277 |
| 5,537,045 | A * | 7/1996 | Henderson | 324/557 |
| 5,770,945 | A * | 6/1998 | Constable | 324/350 |
| 6,063,453 | A * | 5/2000 | Tomida et al. | 427/532 |
| 7,038,456 | B2 * | 5/2006 | Ellingsrud et al. | 324/334 |
| 7,116,108 | B2 | 10/2006 | Constable | |
| 7,307,424 | B2 * | 12/2007 | MacGregor et al. | 324/337 |
| 7,701,803 | B2 * | 4/2010 | Welker | 367/17 |
| 7,800,374 | B2 * | 9/2010 | Strack et al. | 324/365 |
| 8,019,547 | B2 * | 9/2011 | Bryant | 702/7 |
| 8,085,327 | B2 * | 12/2011 | Schrey et al. | 348/308 |
| 8,269,500 | B2 * | 9/2012 | D'eu et al. | 324/345 |
| 2004/0000912 | A1 * | 1/2004 | Conti et al. | 324/350 |
| 2006/0085049 | A1 * | 4/2006 | Cory et al. | 607/48 |
| 2007/0299632 | A1 * | 12/2007 | Bryant | 702/188 |
| 2008/0094067 | A1 * | 4/2008 | Constable et al. | 324/365 |
| 2008/0169817 | A1 * | 7/2008 | Morrison et al. | 324/365 |
| 2008/0238429 | A1 * | 10/2008 | Safinya et al. | 324/348 |
| 2008/0246485 | A1 * | 10/2008 | Hibbs et al. | 324/332 |
| 2009/0091329 | A1 * | 4/2009 | Barsukov et al. | 324/365 |
| 2009/0184715 | A1 * | 7/2009 | Summerfield et al. | 324/334 |
| 2009/0224765 | A1 * | 9/2009 | Tulupov et al. | 324/345 |
| 2010/0230125 | A1 * | 9/2010 | Asplund et al. | 174/6 |
| 2010/0231223 | A1 * | 9/2010 | Ellingsrud et al. | 324/365 |
| 2013/0113489 | A1 * | 5/2013 | Guigne | 324/334 |

FOREIGN PATENT DOCUMENTS

| | | | | |
|---|---|---|---|---|
| CN | 1659450 A | | 8/2005 | |
| GB | 2450158 A | * | 12/2008 | G01V 3/12 |
| WO | WO 03104844 A1 | * | 12/2003 | G01V 3/00 |
| WO | WO 2007136451 A2 | * | 11/2007 | G01V 3/12 |

* cited by examiner

METHOD OF POLES CONFIGURATION WITH FOUR POLES INTER-COMBINATION FOR MARINE ELECTROMAGNETIC SURVEYING

TECHNICAL FIELD

The present invention relates to a field of marine electromagnetic survey technology, and in particular, to a method for configuring four poles included in a seabed acquisition station for marine electromagnetic surveying.

BACKGROUND OF THE INVENTION

At present, for marine electromagnetic surveying, a pair of plastic pipes with high strength that extend from an acquisition station and are mutually perpendicular, are adopted as supports for the whole acquisition station and grounding electrode for electric field data acquisition. Couple pole lines are arranged in the plastic pipes and are connected to a central data recorder. Two electric field components (Ex and Ey) that are mutually perpendicular are recorded for a continuous acquisition of time domain electromagnetic field data. Active electric field is recorded when there is a field source activating signal, while the natural electric field is recorded when there is no activation. The data is processed indoors after acquisition.

The above configuration is substantially the same as the magnetotelluric "+" configuring method on earth. However, as the acquisition station is arranged at seabed in deep sea environment, operation is very difficult. Firstly, it is difficult for the orientation of the poles configuration to meet the design requirement. When the directions of the measured electric fields obliquely intersect with the activation direction, especially when two electric fields both form an angle of about 45° with the activation direction, the effective activation signals are both 70% of those under collinear activation. Further, the recorded electric field is disturbed by signal in another direction, so that the recorded electric field deviates from the receiving requirement for collinear activation in theory. Secondly, it is difficult to ensure that each recording board for every field component works normally. Once there is an error, data about one measuring point may be lost, which means severe loss to marine electromagnetic surveying. Further, as the recording is made through single couple pole, the acquisition quality cannot be assessed, and post-improvement cannot be made.

THE INVENTION AND ITS ADVANTAGES

The purpose of the invention is to provide a method for configuring four poles included in a seabed acquisition station for marine electromagnetic surveying for marine electromagnetic surveying, which facilitates the acquisition quality assessment and denoising for deep sea electromagnetic data and prevents loss of electromagnetic data.

The technical solution embodied by the invention is depicted as follows:

The seabed acquisition station includes six horizontal electric field components by using inter-connected four poles. The six horizontal electric field components are respectively constituted from four tri-pins grounding electrodes pairwise. One of the pins of each of the tri-pins grounding electrodes and the pins of the other three tri-pins grounding electrodes mutually constitute the six horizontal electric field components. Six recording boards simultaneously record data for electromagnetic field over time series.

The inter-connected four poles relate to four tri-pins grounding electrodes and twelve wires.

The tri-pins grounding electrode has three separate pins at the same grounding.

The six horizontal electric field components are formed by pairwise connecting the four tri-pins grounding electrodes through three wires provided within four plastic pipes.

The four poles inter-combination involves four poles: M1, M2, N1 and N2. Each of the poles has three independent grounding electrodes. The pole M1 has grounding electrodes $M1^1$, $M1^2$ and $M1^3$. The pole M2 has grounding electrodes $M2^1$, $M2^2$ and $M2^3$. The pole N1 has grounding electrodes $N1^1$, $N1^2$ and $N1^3$. The pole N2 has grounding electrodes $N2^1$, $N2^2$ and $N2^3$. The grounding electrodes within one single pole are not connected to each other, and they each connect to one of the grounding electrodes of other pole. The electrodes $M1^1$, $M1^2$ and $M1^3$ in the pole M1 respectively connect to the electrodes $N1^1$, $N2^1$ and $M2^1$, so as to form three electric field components $M1^1N1^1$, $M1^2N2^1$ and $M1^3M2^1$. Likewise, the three electrodes in the pole M2 respectively connect to the electrodes in the poles M1, N1 and N2, so as to form the components $M2^1M1^3$, $M2^2N1^2$ and $M2^3N2^3$. Likewise, the three electrodes in the pole N1 respectively connect to the electrodes in the poles M1, M2 and N2, so as to form the components $N1^1M1^1$, $N1^2M2^2$ and $N1^3N2^2$. Likewise, the three electrodes in the pole N2 respectively connect to the electrodes in the poles M1, M2 and N1, so as to form the components $N2^1M1^2$, $N2^3M2^3$ and $N2^2N1^3$. In addition, the components $M1^3M2^1$ and $M2^1M1^3$, $M1^1N1^1$ and $N1^1M1^1$, $M1^2N2^1$ and $N2^1M1^2$, $M2^3N2^3$ and $N2^3M2^3$, $M2^2N1^2$ and $N1^2M2^2$, and $N1^3N2^2$ and $N2^2N1^3$, respectively are the same.

In the six horizontal electric field components formed, the components $M2^2N1^2$ and $M1^2N2^1$ are orthogonal to each other, the components $M1^3M2^1$ and $N1^3N2^2$ are parallel to each other, and the components $M1^1N1^1$ and $M2^3N2^3$ are parallel to each other.

The data is simultaneously recorded through the six horizontal electric field components $M1^1N1^1$, $M1^2N2^1$, $M1^3M2^1$, $N1^3N2^2$, $M2^3N2^3$ and $M2^2N1^2$ with the same acquisition parameter.

DETAILED DESCRIPTION OF THE INVENTION

Hereinafter, the specific steps for embodying the present invention would be described.

Figure 1:
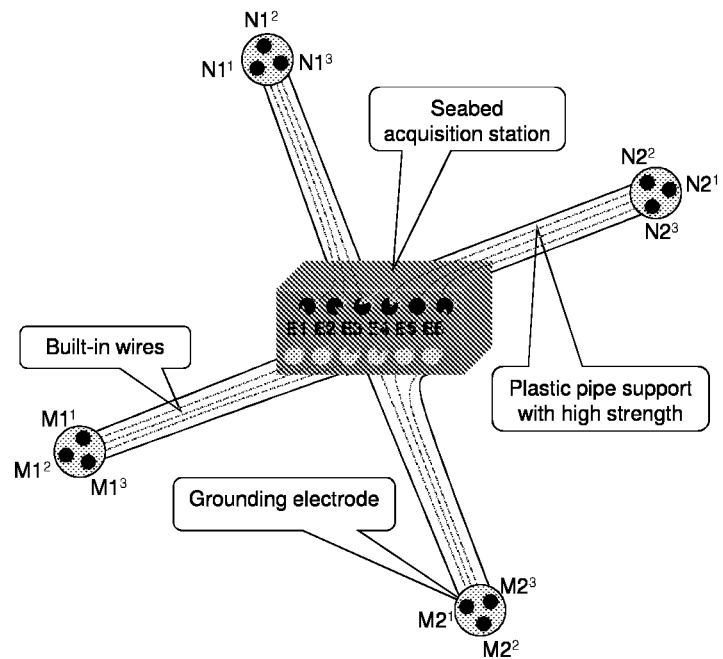
FIG. 1 is a schematic diagram of the wire connection of the four poles inter-combination configuration.

1) Adopting four poles inter-combination connection in the acquisition station:

Six horizontal electric field components are required in the acquisition station (referring to FIG. 1, the acquisition station comprising six black panels and six white terminals, they pairwise forming one circuit). By pairwise connecting four tri-pins grounding electrodes through wires provided within four plastic pipes with high strength, six circuits are connected in, wherein three wires are provided within each pipe of four plastic pipes.

Figure 2:
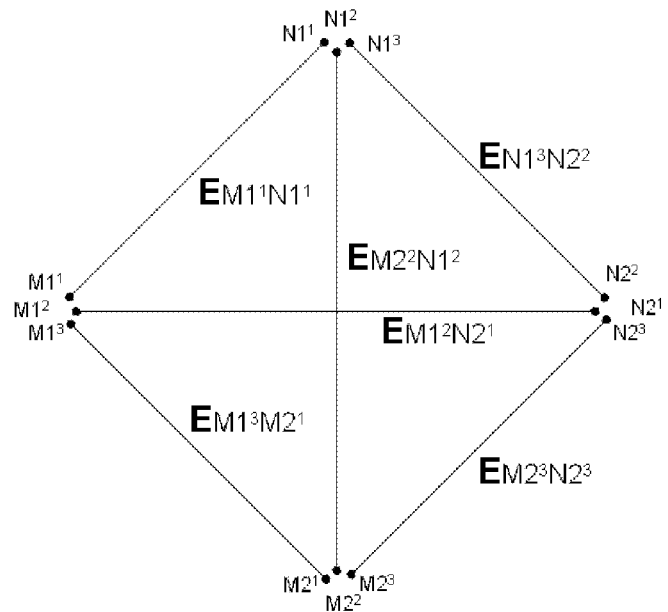
FIG. 2 is a plan schematic diagram of the electrodes of the four poles inter-combination configuration.

After the four poles inter-combination, six horizontal electric field components are formed. Three pairs of couple poles are formed by connecting one grounding electrode in one pole and another one grounding electrode of the three grounding electrodes in the other three poles. The electrodes $M1^1$, $M1^2$ and $M1^3$ in the pole M1 respectively connect to the electrodes $N1^1$, $N2^1$ and $M2^1$, so as to form the electric field components $M1^1N1^1$, $M1^2N2^1$ and $M1^3M2^1$. The electrodes $M2^1$, $M2^2$ and $M2^3$ in the pole M2 respectively connect to the electrodes $M1^3$, $N1^2$ and $N2^3$, so as to form the components $M2^1M1^3$, $M2^2N1^2$ and $M2^3N2^3$. The electrodes $N1^1$, $N1^2$ and $N1^3$ in the pole N1 respectively connect to the electrodes $M1^1$, $M2^2$ and $N2^2$ so as to form the components $N1^1M1^1$, $N1^2M2^2$ and $N1^3N2^2$. The electrodes $N2^1$, $N2^2$ and $N2^3$ in the pole N2 respectively connect to the electrodes $M1^2$, $N1^3$ and $M2^3$, so as to form the components $N_2^1M1^2$, $N2^2N1^3$ and $N2^3M2^3$. In addition, the components $M1^3M2^1$ and $M2^1M1^3$, $M1^1N1^1$ and $N1^1M1^1$, $M1^2N2^1$ and $N2^1M1^2$, $M2^3N2^3$ and $N2^3M2^3$, $M2^2N1^2$ and $N1^2M2^2$, and $N1^3N2^2$ and $N2^2N1^3$, respectively are the same couple pole. Therefore, six horizontal electric field components are formed, wherein the components $M2^2N1^2$ and $M1^2N2^1$ are orthogonal to each other (with traditional method), the new components $M1^3M2^1$ and $N1^3N2^2$ are parallel to each other, and the components $M1^1N1^1$ and $M2^3N2^3$ are parallel to each other (referring to FIG. 2).

2) Data Recording:

Except that the data is simultaneously recorded through the six horizontal circuits $M1^1N1^1$, $M1^2N2^1$, $M1^3M2^1$, $N1^3N2^2$, $M2^3N2^3$ and $M2^2N1^2$ with the same acquisition parameter, others are the same as the conventional method, that is, the data for the natural electromagnetic field over time series are acquired when there is no activation, and the electromagnetic data for artificial source are acquired when there is an artificial source activation.

INDUSTRIAL APPLICABILITY

The present invention adopts four additional circuits, however the weight and the volume of the electronic integration board would not increase so much, and the four additional circuits may be integrated into the original electronic board. The present invention adopts eight additional wires, which are built into the existing four plastic supporting pipes when building the seabed acquisition station, the additional weight of the wires being negligible to the whole acquisition station, without bringing any additional work to field operation.

The present invention improves the flexibility of the construction of the acquisition station and the activation field source, makes it possible to reduce noise and process the static displacement effect, specially improves security for data during seabed construction, and is specially adapted for electromagnetic data acquisition in deep sea.

The present invention effectively ensure that the electric field recording with an angle less than 22.5 degree to the activating direction is achieved regardless of the orientation of the acquisition station, and that the worst effective activation signal may reach 76.5% of that under collinear activation. It is ensured that the activation field source and the couple pole for recording the electric field are under strong coupling, and the requirements on the orientation of the acquisition station and on the dragging direction and position of the activation field source in data acquisition are lowered.

With the present invention, even if half of the recording boards break down, two electric field components perpendicular to each other may still be obtained.

Through obtaining the diagonal electric field by means of two electric field components on adjacent edges, the present invention facilitates quality assessment and denoising for deep sea electromagnetic data.

What is claimed is:

1. A method for configuring four poles included in a seabed acquisition station for marine electromagnetic surveying, wherein the four poles are M1, M2, N1 and N2, respectively, the pole M1 including grounded pins $M1^1$, $M1^2$ and $M1^3$, the pole M2 including grounded pins $M2^1$, $M2^2$ and $M2^3$, the pole N1 including grounded pins $N1^1$, $N1^2$ and $N1^3$, and the pole N2 including grounded pins $N2^1$, $N2^2$ and $N2^3$, the method comprising, connecting the pins $M1^1$, $M1^2$ and $M1^3$ of the pole M1 to the pins $N1^1$, $N2^1$ and $M2^1$, respectively, so as to form three electric field components $M1^1N1^1$, $M1^2N2^1$ and $M1^3M2^1$, connecting the pins $M2^1$, $M2^2$ and $M2^3$ of the pole M2 to the pins $M1^3$, $N1^2$ and $N2^3$, respectively, so as to form three electric components $M2^1M1^3$, $M2^2N1^2$ and $M2^3N2^3$, connecting the pins $N1^1$, $N1^2$ and $N1^3$ of the pole N1 to the pins $M1^1$, $M2^2$ and $N2^2$, respectively, so as to form three electric components $N1^1M1^1$, $N1^2M2^2$ and $N1^3N2^2$, and connecting the pins $N2^1$, $N2^2$ and $N2^3$ of the pole N2 to the pins $M1^2$, $M2^3$ and $N1^3$, respectively, so as to form three electric components $N2^1M1^2$, $N2^3M2^3$ and $N2^2N1^3$, wherein the electric components $M1^3M2^1$ and $M2^1M1^3$, $M1^1N1^1$ and $N1^1M1^1$, $M1^2N2^1$ and $N2^1M1^2$, $M2^3N2^3$ and $N2^3M2^3$, $M2^2N1^2$ and $N1^2M2^2$, and $N1^3N2^2$ and $N2^2N1^3$, respectively are the same electric field components, so as to forming six horizontal electric field components for simultaneously recording the data for electromagnetic field over time series.

2. The method for configuring four poles included in a seabed acquisition station for marine electromagnetic surveying, according to claim 1, characterized in that, the four poles are pairwise connected by using twelve wires.

3. The method for configuring four poles included in a seabed acquisition station for marine electromagnetic surveying according to claim 1, the pins of the four poles M1, M2, N1 and N2 are pairwise connected through three wires respectively provided in four plastic pipes.

4. The method for configuring four poles included in a seabed acquisition station for marine electromagnetic surveying according to claim 1, characterized in that, the grounded pins within each one of the four poles M1, M2, N1 and N2 are not connected to each other.

5. The method for configuring four poles included in a seabed acquisition station for marine electromagnetic surveying according to claim 1, characterized in that, in the six horizontal electric field components formed, the components $M2^2N1^2$ and $M1^2N2^1$ are orthogonal to each other, the electric field components $M1^3M2^1$ and $N1^3N2^2$ are parallel to each other, and the electric field components $M1^1N1^1$ and $M2^3N2^3$ are parallel to each other.

6. The method for configuring four poles included in a seabed acquisition station for marine electromagnetic surveying according to claim 1, characterized in that, the data is simultaneously recorded through the six horizontal electric field components $M1^1N1^1$, $M1^2N2^1$, $M1^3M2^1$, $N1^3N2^2$, $M2^3N2^3$ and $M2^2N1^2$ with the same an identical acquisition parameter.

* * * * *